(12) United States Patent
Zhu et al.

(10) Patent No.: US 9,252,104 B2
(45) Date of Patent: Feb. 2, 2016

(54) COMPLEMENTARY BACK END OF LINE (BEOL) CAPACITOR

(71) Applicant: QUALCOMM INCORPORATED, San Diego, CA (US)

(72) Inventors: John J. Zhu, San Diego, CA (US); Bin Yang, San Diego, CA (US); Pr Chidambaram, San Diego, CA (US); Lixin Ge, San Diego, CA (US); Jihong Choi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/512,191

(22) Filed: Oct. 10, 2014

(65) Prior Publication Data

US 2015/0028452 A1    Jan. 29, 2015

Related U.S. Application Data

(62) Division of application No. 13/770,127, filed on Feb. 19, 2013, now Pat. No. 8,980,708.

(51) Int. Cl.
*H01L 29/00* (2006.01)
*H01L 23/538* (2006.01)
(Continued)

(52) U.S. Cl.
CPC .......... *H01L 23/538* (2013.01); *H01L 23/5223* (2013.01); *H01L 27/0805* (2013.01); *H01L 28/40* (2013.01); *H01L 2924/0002* (2013.01)

(58) Field of Classification Search
CPC .................. H01L 21/02175; H01L 21/31683; H01L 23/538; H01L 23/522; H01L 23/5223; H01L 23/4951; H01L 27/224; H01L 27/0805; H01L 27/08; H01L 27/14; H01L 27/112; H01L 27/222; H01L 27/1085; H01L 27/0629; H01L 28/40; H01L 29/7869

USPC ............ 257/532, 68, 71, 296, 298, 310, 334, 257/340, 351, 478, 491, 499, E21.006, 257/E21.645, E21.648, E21.649, E27.048, 257/E27, 49

See application file for complete search history.

(56) References Cited

U.S. PATENT DOCUMENTS

| 6,680,521 B1 | 1/2004 | Kar-Roy et al. |
| 6,723,600 B2 | 4/2004 | Wong et al. |

(Continued)

FOREIGN PATENT DOCUMENTS

| DE | 102008028554 A1 | 1/2009 |
| JP | S63120457 A | 5/1988 |
| JP | 2006049486 A | 2/2006 |

OTHER PUBLICATIONS

International Search Report and Written Opinion—PCT/US2014/015855—ISA/EPO—Jun. 30, 2014.

(Continued)

*Primary Examiner* — David Nhu
(74) *Attorney, Agent, or Firm* — Seyfarth Shaw LLP

(57) ABSTRACT

A complementary back end of line (BEOL) capacitor (CBC) structure includes a metal oxide metal (MOM) capacitor structure. The MOM capacitor structure is coupled to a first upper interconnect layer of an interconnect stack of an integrated circuit (IC) device. The MOM capacitor structure includes a lower interconnect layer of the interconnect stack. The CBC structure also includes a second upper interconnect layer of the interconnect stack coupled to the MOM capacitor structure. The CBC structure also includes a metal insulator metal (MIM) capacitor layer between the first upper interconnect layer and the second upper interconnect layer. In addition, CBC structure also includes a MIM capacitor structure coupled to the MOM capacitor structure. The MIM capacitor structure includes a first capacitor plate having a portion of the first upper interconnect layer, and a second capacitor plate having a portion of the MIM capacitor layer(s).

12 Claims, 8 Drawing Sheets

(51) Int. Cl.
*H01L 27/08* (2006.01)
*H01L 49/02* (2006.01)
*H01L 23/522* (2006.01)

(56) References Cited

U.S. PATENT DOCUMENTS

| | | | |
|---|---|---|---|
| 6,830,971 B2 | 12/2004 | Balakumar et al. | |
| 7,095,073 B2 | 8/2006 | Balakumar et al. | |
| 7,230,434 B1 | 6/2007 | Sasaki | |
| 7,317,221 B2 | 1/2008 | Chang et al. | |
| 7,335,956 B2 | 2/2008 | Chen et al. | |
| 7,768,054 B2 | 8/2010 | Benetik et al. | |
| 8,053,865 B2 | 11/2011 | Chang et al. | |
| 8,169,014 B2 | 5/2012 | Chen et al. | |
| 8,980,708 B2 * | 3/2015 | Zhu et al. | 438/238 |
| 2007/0102745 A1 | 5/2007 | Hsu et al. | |
| 2007/0268653 A1 | 11/2007 | Kim et al. | |
| 2013/0256834 A1 | 10/2013 | Tan et al. | |
| 2014/0231957 A1 | 8/2014 | Zhu et al. | |

OTHER PUBLICATIONS

Zhu J., et al., "Capacitor of MOM and MIM structural combination," Qualcomm CDMA Technologies, Power Point Presentation, Apr. 30, 2012, pp. 1-2.

* cited by examiner

COMPLEMENTARY BACK END OF LINE (BEOL) CAPACITOR

CROSS-REFERENCE TO RELATED APPLICATION

This application is a divisional of U.S. patent application Ser. No. 13/770,127, entitled "COMPLEMENTARY BACK END OF LINE (BEOL) CAPACITOR," filed on Feb. 19, 2013, which issued on Mar. 17, 2015, as U.S. Pat. No. 8,980,708 B2, the disclosure of which is expressly incorporated by reference herein in its entirety.

TECHNICAL FIELD

The present disclosure relates generally to capacitors. More specifically, the disclosure relates to a complementary back end of line (BEOL) capacitor structure that combines a metal oxide metal (MOM) capacitor and one or more metal insulator metal (MIM) capacitors from different conductive interconnect layers.

BACKGROUND

Capacitors are widely used in integrated circuits. FIG. 1 is a block diagram illustrating a cross section of an integrated circuit (IC) device 100 including an interconnect stack 110. The interconnect stack 110 of the IC device 100 includes multiple conductive interconnect layers (M1, . . . , M9, M10) on a semiconductor substrate (e.g., a silicon wafer) 102. The semiconductor substrate 102 supports metal oxide metal (MOM) capacitors 130. In this example, a first MOM capacitor 130A is formed in the M3 and M4 interconnect layers, and a second MOM capacitor 130B is formed in the M5 and M6 interconnect layers. The MOM capacitors 130 (130A and 130B) are formed from lateral conductive fingers of different polarities using the conductive interconnect layers (M3 and M4/M5 and M6) of the interconnect stack 110. An dielectric (not shown) is provided between the conductive fingers.

In this example, the MOM capacitors 130 are formed within the lower conductive interconnect layers (e.g., M1-M6) of the interconnect stack 110. The lower conductive interconnect layers of the interconnect stack 110 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 1, the MOM capacitors 130 make use of a lateral (intra layer) capacitive coupling 140 between fingers formed by standard metallization of the conductive interconnects (e.g., wiring lines and vias). The lateral coupling 140 within the MOM capacitors 130 provides improved matching characteristics when compared to the vertical coupling of parallel vertical plate capacitors. The improved matching characteristics of the MOM capacitors 130 are the result of improved process control of the lateral dimensions within the interconnect stack 110. By contrast, the process controls of the vertical dimensions of the conductive interconnect and dielectric layer thickness within the interconnect stack 110 are less precise for providing small value capacitance.

It is becoming significantly more challenging to fabricate high density capacitance. Consequently, using only MOM capacitors in future process technologies may be insufficient to provide high density capacitance for IC devices.

A metal insulator metal (MIM) capacitor in the back end of line (BEOL) layers has been proposed. The MIM capacitor uses vertical plate to plate coupling. This solution, however, involves additional masks as well as a high-K (HiK) oxide deposition process to achieve an increased capacitor density. In addition, MIM capacitors are generally formed between the upper conductive interconnect layers (e.g., M9 and M10) of the interconnect stack 110.

SUMMARY

The present disclosure describes a complementary back end of line (BEOL) capacitor (CBC) structure that has a combined MIM and MOM structure. The combined structure increases capacitance density.

In one aspect of the present disclosure, a complementary back end of line (BEOL) capacitor (CBC) structure has a metal oxide metal (MOM) capacitor structure coupled to a first upper interconnect layer of an interconnect stack of an integrated circuit (IC) device. The MOM capacitor structure includes at least one lower interconnect layer of the interconnect stack. The CBC structure may also include a second upper interconnect layer of the interconnect stack coupled to the MOM capacitor structure. The CBC structure also includes at least one metal insulator metal (MIM) capacitor layer between the first upper interconnect layer and the second upper interconnect layer. In addition, the CBC structure may also include a MIM capacitor structure coupled to the MOM capacitor structure. The MIM capacitor structure includes a first capacitor plate having at least a portion of the first upper interconnect layer, and a second capacitor plate having at least a portion of the MIM capacitor layer(s).

According to another aspect of the present disclosure, a method for fabricating a complementary back end of line (BEOL) capacitor (CBC) structure is described. The method includes forming a metal oxide metal (MOM) capacitor structure within lower interconnect layers of an interconnect stack of an integrated circuit (IC) device. The method also includes depositing at least one metal insulator metal (MIM) capacitor layer between a first upper interconnect layer and a second upper interconnect layer of the interconnect stack. The method further includes forming a MIM capacitor structure coupled to the MOM capacitor structure. The MIM capacitor structure includes a first capacitor plate having at least a portion of the first upper interconnect layer, and a second capacitor plate having at least a portion of the MIM capacitor layer(s).

In a further aspect of the present disclosure, a complementary back end of line (BEOL) capacitor (CBC) structure is described. The CBC structure includes a means for storing electric charge coupled to a first upper interconnect layer of an interconnect stack of an integrated circuit (IC) device. The electric charge storing means includes at least one lower interconnect layer of the interconnect stack. The CBC structure may also include a second upper interconnect layer of the interconnect stack coupled to the electric charge storing means. The CBC structure also includes at least one metal insulator metal (MIM) capacitor layer between the first upper interconnect layer and the second upper interconnect layer. In addition, CBC structure may also include a MIM capacitor structure coupled to the MOM capacitor structure. The MIM capacitor structure includes a first capacitor plate as at least a portion of the first upper interconnect layer, and a second capacitor plate as at least a portion of the MIM capacitor layer(s).

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

One aspect of the disclosure describes a complementary back end of line (BEOL) capacitor (CBC) structure. In one configuration, a CBC structure combines a metal oxide metal (MOM) capacitor structure and one or more metal insulator metal (MIM) capacitor structures. Combining a MOM capacitor structure with a MIM capacitor structure from different conductive interconnect layers provides the complementary BEOL capacitor structure with increased capacitance area density. In this configuration, the complementary BEOL capacitor structure combines the lateral coupling of the conductive fingers of a MOM capacitor structure with the vertical coupling of the parallel plates of a MIM capacitor structure. The complementary BEOL capacitor structure exhibits increased capacitor area density by combining capacitor structures from different conductive interconnect layers of an interconnect stack. In this configuration, the interconnect stack of an IC device includes multiple conductive interconnect layers (e.g., conductive layers M1 to M10). While the MOM capacitor structure may be formed using a conventional process, in this configuration, a process for forming a MIM capacitor is altered to form the complementary BEOL capacitor structure.

Figure 2:
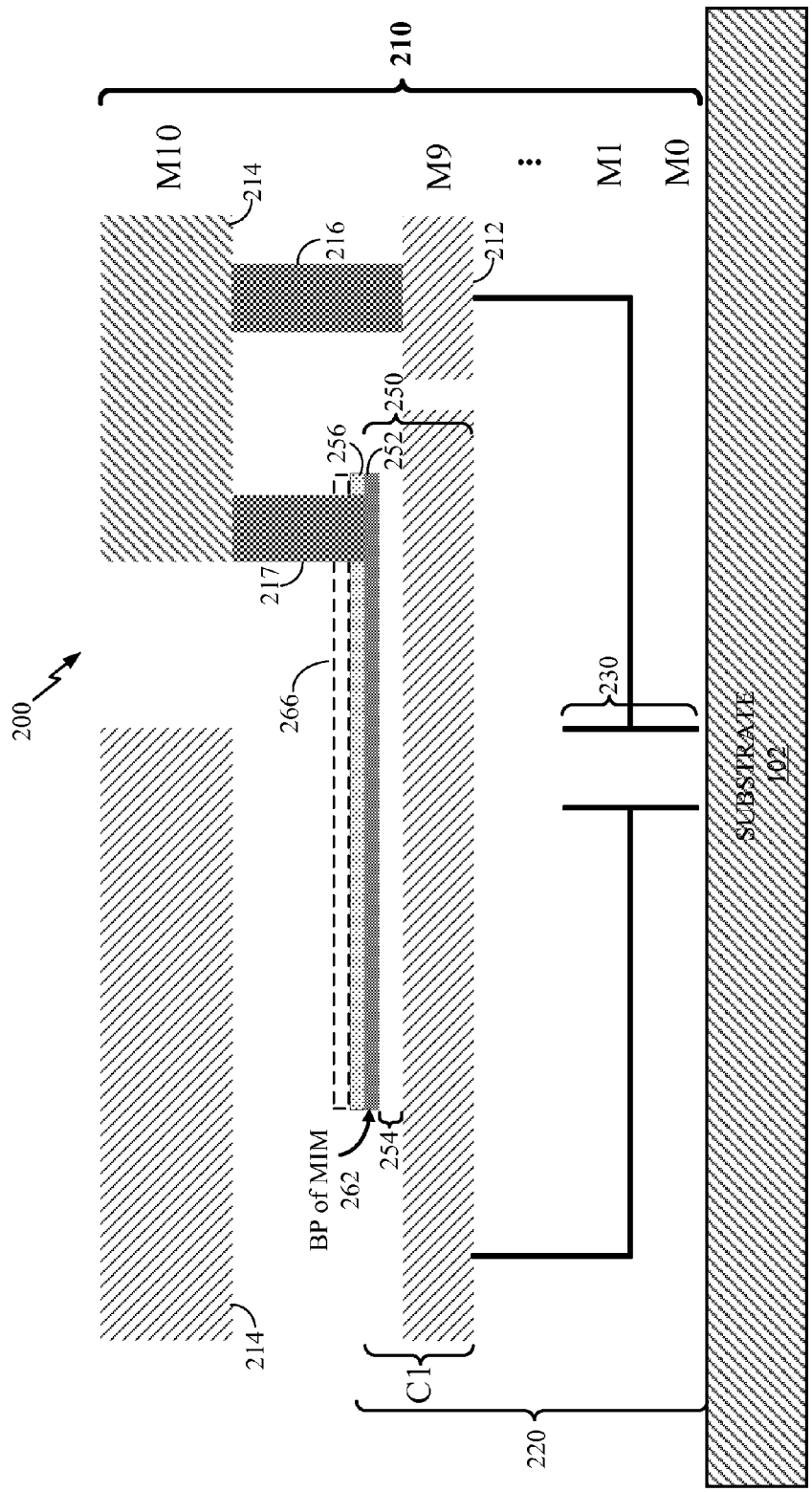
FIG. 2 shows a cross-sectional view illustrating an integrated circuit (IC) device including a complementary back end of line (BEOL) capacitor structure according to an aspect of the present disclosure.

A MIM capacitor structure may be formed between the upper interconnect layers of an interconnect stack (e.g., M9 and M10). In one configuration, a single one of a top plate or a bottom plate of a MIM capacitor is used to form a MIM capacitor structure between the top/bottom plate of the MIM capacitor and one of the upper conductive interconnect layers that is immediately below the top/bottom plate. In particular, one aspect of the present disclosure couples a MIM capacitor structure with the positive and negative nodes of a MOM capacitor structure to form a complementary BEOL capacitor structure, for example, as shown in FIG. 2. The use of one of the upper interconnect layers of an interconnect stack as a plate of the MIM capacitor structure enables a simplified fabrication process. Fabrication of the MIM capacitor in this manner avoids an additional deposition and mask for fabricating one of the plates of a MIM capacitor. That is, a MIM capacitor structure is formed between a single MIM capacitor plate and an adjacent upper interconnect layer, for example, as shown in FIG. 2.

FIG. 2 shows a cross-sectional view illustrating an integrated circuit (IC) device 200 including a complementary back end of line (BEOL) capacitor (CBC) structure 220 according to one aspect of the disclosure. Representatively, the IC device 200 includes a semiconductor substrate (e.g., a silicon wafer) 102 that supports an interconnect stack 210. In this configuration, the interconnect stack 210 includes multiple conductive interconnects layers (e.g., M0 to M10). Although described with reference to the conductive interconnect layers M0 to M10, the present disclosure may be applied to any IC device that includes an interconnect stack, where the number of the conductive interconnect layers is determined by the relevant process technology. As described herein, the term "semiconductor substrate" may refer to a substrate of a diced wafer or may refer to the substrate of a wafer that is not diced, i.e., a wafer itself. The term "metal" can be any conductive or semiconductive material.

Figure 1:
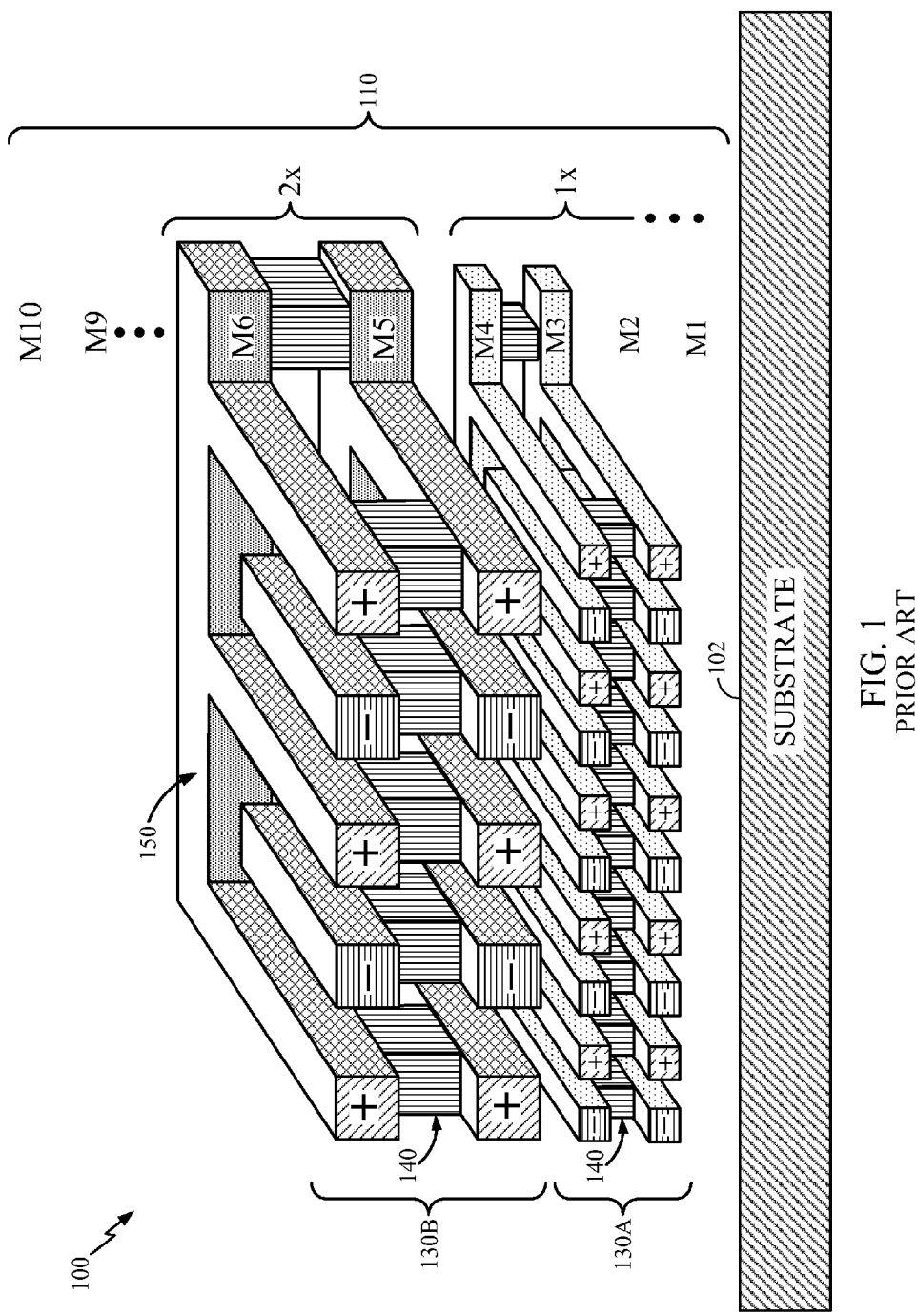
FIG. 1 is a block diagram illustrating an integrated circuit (IC) device including an interconnect stack that contains conventional metal oxide metal (MOM) capacitor structures.

In FIG. 2, a metal oxide metal (MOM) capacitor structure 230 is formed within the lower conductive interconnect layers (e.g., M1-M6) of the interconnect stack 110, for example, as shown in FIG. 1. In this configuration, a conventional process of forming a metal insulator metal (MIM) capacitor between a first upper interconnect layer 212 (M9) and a second upper interconnect layer 214 (M10) is modified. Rather than using the conventional MIM process to form a bottom plate 262 and a top plate 266 of a MIM capacitor, in this configuration, a MIM capacitor structure 250 includes a top plate 252 and a first upper interconnect layer 212 (e.g., M9) as a bottom plate. That is, the conventional MIM mask or process is modified at this location to skip the mask and deposition for fabricating the top plate of a MIM capacitor that may be formed between the first upper interconnect layer 212 and a second upper interconnect layer 214. The top plate 266 is shown in dotted lines because it will not actually exist in this configuration. (See FIG. 6 for an example of a MIM capacitor with a top plate 466.)

In this configuration, the top plate 252 of the MIM capacitor structure 250 is formed above the first upper interconnect layer 212 (M9) by using a bottom plate mask of the conventional MIM process. An optional dielectric layer 256 is formed on the top plate 252 of the MIM capacitor structure 250, which is coupled to the second upper interconnect layer 214 with a via 217. In addition, the first upper interconnect layer 212 (M9) is coupled to the second upper interconnect layer 214 (M10) using a via 216.

A capacitance density (C1) of the MIM capacitor structure 250 may be determined as follows:

A distance 254 between the top plate 252 and the first upper interconnect layer 212 (the bottom plate) of the MIM capacitor structure 250 is generally in the range of fifty (50) to one hundred (100) nanometers according to the conventional MIM process. Assuming a dielectric constant (k1) equal to five (5) and a distance 254 between the top plate 252 and the first upper interconnect layer 212 is 50 nanometers, the capacitance density (C1) of the MIM capacitor structure 250 equals approximately 0.89 femtofarads (fF) per micro meter squared (fF/$\mu m^2$). A capacitance density of the MOM capacitor structure 230 is approximately 0.78 fF/$\mu m^2$ for each layer (assuming a fine line configuration according to a twenty eight nanometer process technology and a ninety (90) nanometer pitch of one of the lower conductive interconnect layers (e.g., M1 to M6)). The capacitance density (C1) of the MIM capacitor structure 250 is approximately equal to the capacitance density of one lower (or finer) layer of the MOM capacitor structure 230, when fabricated according to the noted fine line configuration.

Figure 3:
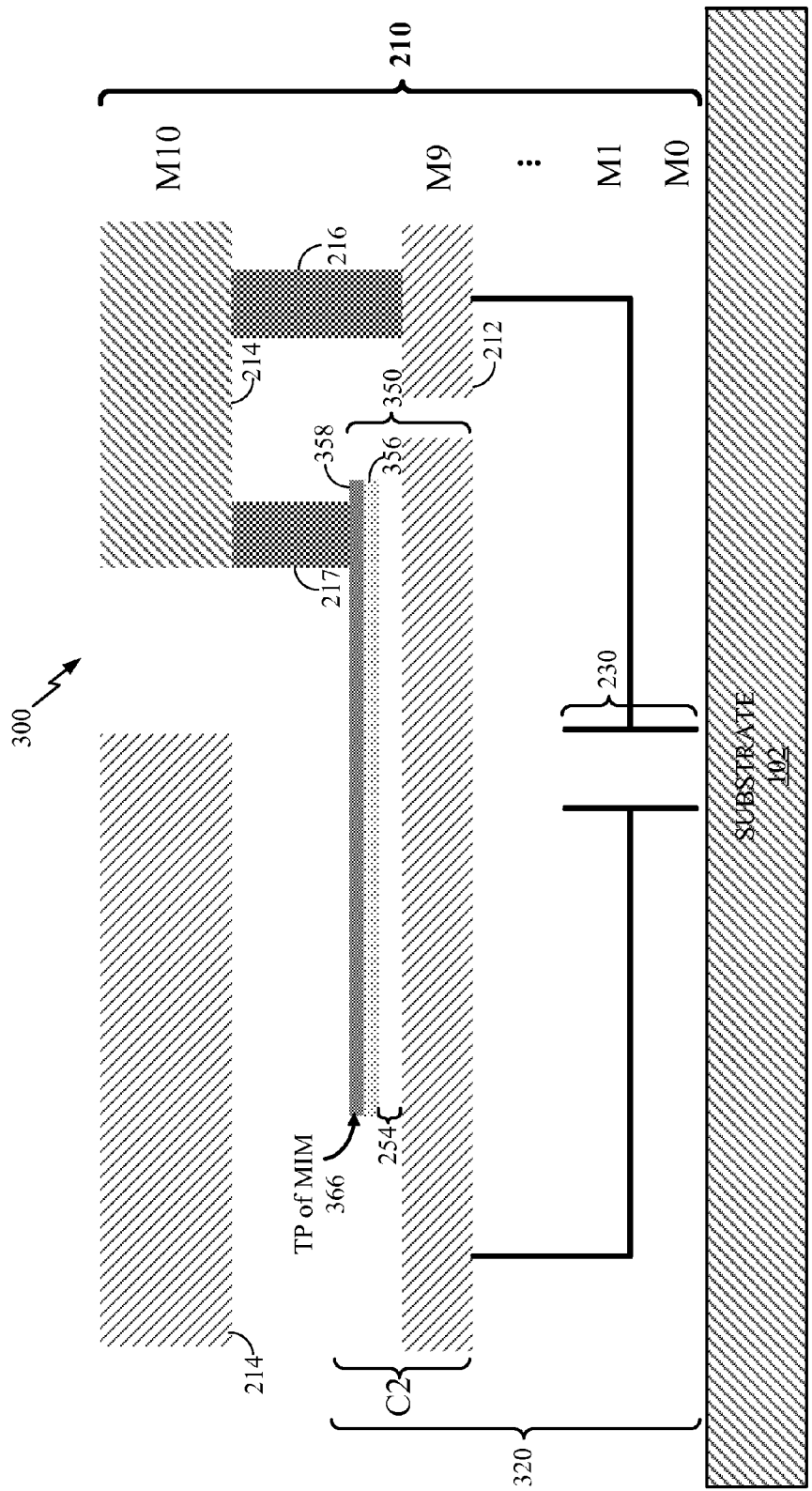
FIG. 3 shows a cross-sectional view illustrating an integrated circuit (IC) device including a complementary back end of line (BEOL) capacitor structure according to another aspect of the present disclosure.

FIG. 3 shows a cross-sectional view illustrating an integrated circuit (IC) device 300 including a complementary back end of line (BEOL) capacitor (CBC) structure 320 according to another aspect of the present disclosure. In one configuration, a MIM capacitor structure 350 includes a top plate 358, a high-K dielectric layer 356 and the first upper interconnect layer 212 (e.g., M9) as a bottom plate. In this configuration, the top plate 358 is fabricated using a modified MIM process to fabricate only a top plate 366 of a MIM capacitor. That is, the conventional MIM process is modified to skip the deposition and mask for fabricating the bottom plate of a MIM capacitor that may be formed between the first upper interconnect layer 212 (M9) and the second upper interconnect layer 214 (M10). In addition, a high-K dielectric layer 356 may be deposited on the top plate 358 to increase a capacitance density (C2) of the MIM capacitor structure 350. A capacitance density of the CBC structure 320 may include the combined parallel capacitance density of the MIM capacitor structure 350 (C2) and the MOM capacitor structure 230.

Figure 4:
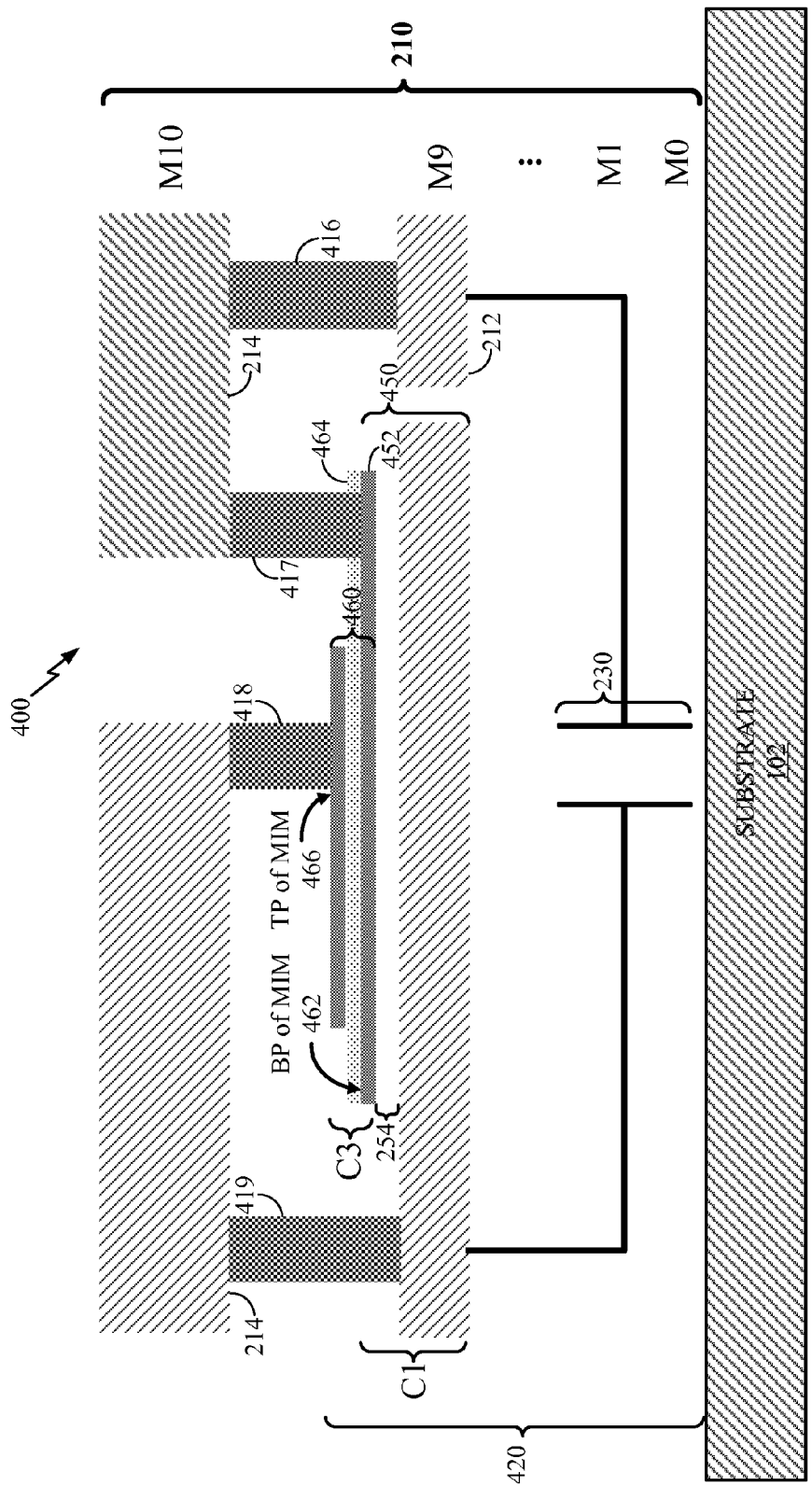
FIG. 4 shows a cross-sectional view illustrating an integrated circuit (IC) device including a complementary back end of line (BEOL) capacitor structure according to a further aspect of the present disclosure.

FIG. 4 shows a cross-sectional view illustrating an integrated circuit (IC) device 400 including a complementary back end of line (BEOL) capacitor (CBC) structure 420 according to another aspect of the disclosure. In this configuration, a first MIM capacitor structure 450 includes a top plate 452 and the first upper interconnect layer 212 as a bottom plate. That is, the bottom plate of the first MIM capacitor structure 450 corresponds to the first upper interconnect layer 212 (e.g., M9) of the interconnect stack 210. In addition, a second MIM capacitor structure 460 is formed between the first upper interconnect layer 212 (M9) and the second upper interconnect layer 214 (M10). The second MIM capacitor structure 460 includes a bottom plate 462, a dielectric layer 464, and a top plate 466. The bottom plate 462 is coupled to the first upper interconnect layer 212 and the second upper interconnect layer 214 with vias 416 and 417. The top plate 466 is coupled to the first upper interconnect layer 212 and the second upper interconnect layer 214 with vias 418 and 419.

As further illustrated in FIG. 4, the first MIM capacitor structure 450 and the second MIM capacitor structure 460 share the top plate 452 and the bottom plate 462. That is, the bottom plate of the second MIM capacitor structure 460 also functions as the top plate 452 of the first MIM capacitor structure 450. The CBC structure 420 may include the combined parallel capacitance density of the first MIM capacitor structure 450 (C1), the second MIM capacitor structure 460 (C3), and the MOM capacitor structure 230.

Figure 5:
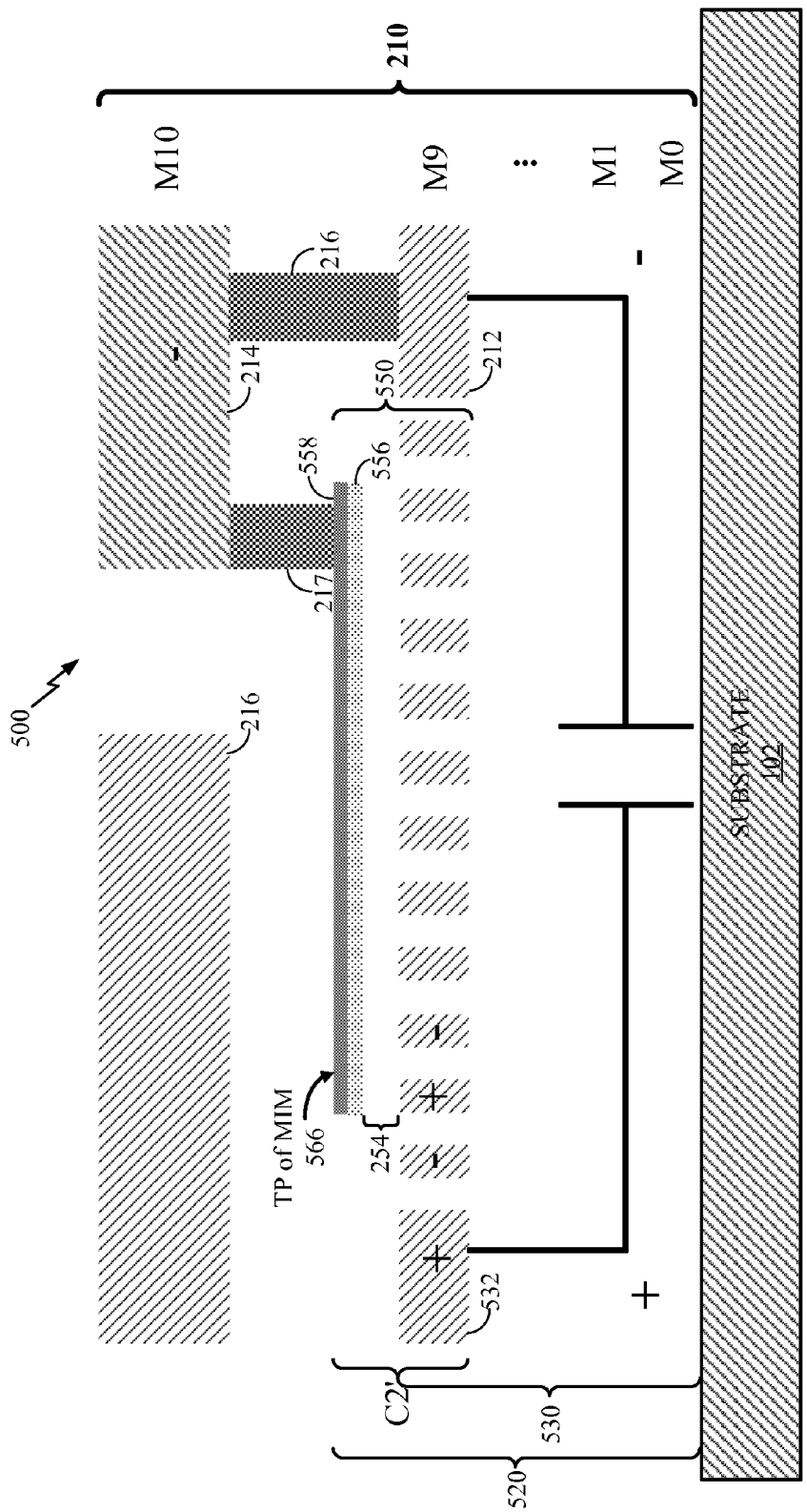
FIG. 5 shows a cross-sectional view illustrating an integrated circuit (IC) device including a complementary back end of line (BEOL) capacitor structure according to another aspect of the present disclosure.

FIG. 5 shows a cross-sectional view illustrating an integrated circuit (IC) device 500, including a complementary back end of line (BEOL) capacitor (CBC) structure 520 according to a further aspect of the present disclosure. In this configuration, an upper layer 532 of a MOM capacitor structure 530 is the first upper interconnect layer 212 (M9) of the interconnect stack 210. Although the upper layer 532 of the MOM capacitor structure 530 is shown to include parallel conductive fingers, the conductive fingers of the MOM capacitor structure 530 may be arranged in a parallel, an orthogonal, or other like hybrid configuration. A MIM capacitor structure 550 may share the upper layer 532 of the MOM capacitor structure 530 to provide a bottom plate. In this configuration, the MIM capacitor structure 550 includes a top plate 558, a high-k dielectric layer 556 and a first upper interconnect layer 212 as a bottom plate.

In this configuration, the top plate 558 may be fabricated using a modified MIM process to fabricate only a top plate 566 of a MIM capacitor. That is, the conventional MIM process is modified to skip the mask and deposition for fabricating the bottom plate of a MIM capacitor formed between the first upper interconnect layer 212 and the second upper interconnect layer 214. In addition, a high-K dielectric layer 556 may be deposited on the top plate 558 to increase the capacitance density (C2') of the MIM capacitor structure 550. In this configuration, the capacitance density (C2') of the MIM capacitor structure 550 is less than the capacitance density (C2) of the MIM capacitor structure 350 of FIG. 3.

Figure 6:
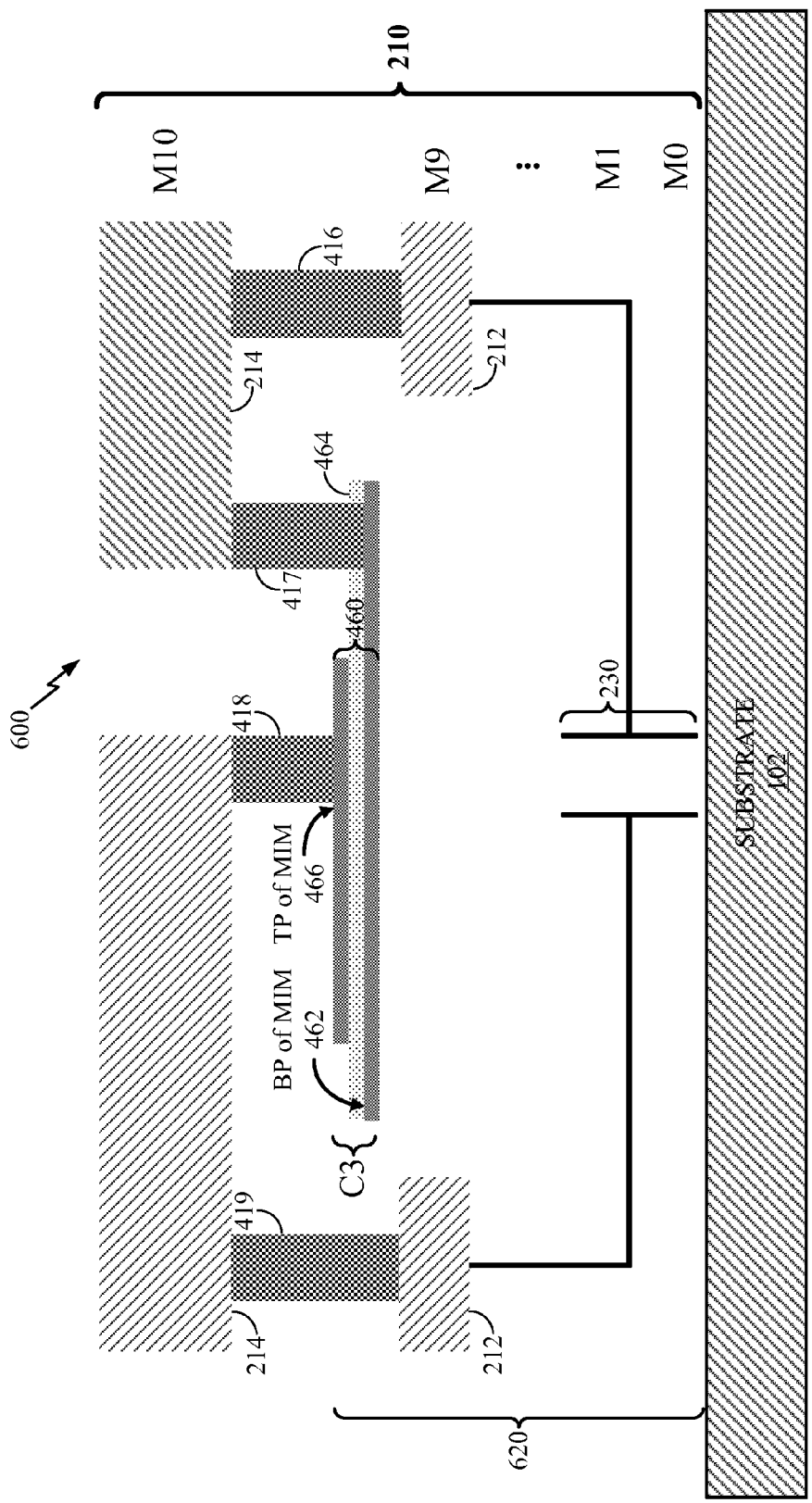
FIG. 6 shows a cross-sectional view illustrating an integrated circuit (IC) device including a complementary back end of line (BEOL) capacitor structure according to an additional aspect of the present disclosure.

FIG. 6 shows a cross-sectional view illustrating an integrated circuit (IC) device 600 including a complementary back end of line (BEOL) capacitor (CBC) structure 620 according to an additional aspect of the present disclosure. In this configuration, a MIM capacitor structure 460 is formed between the first upper interconnect layer 212 and the second upper interconnect layer 214. The first upper interconnect layer 212, however, is modified so that the first upper interconnect layer 212 does not provide a bottom plate for formation of an additional MIM capacitor structure, for example, as shown in FIG. 4. In this configuration, the CBC structure 620 may include the combined parallel capacitance density of the MIM capacitor structure 460 (C3) and the MOM capacitor structure 230.

Figure 7:
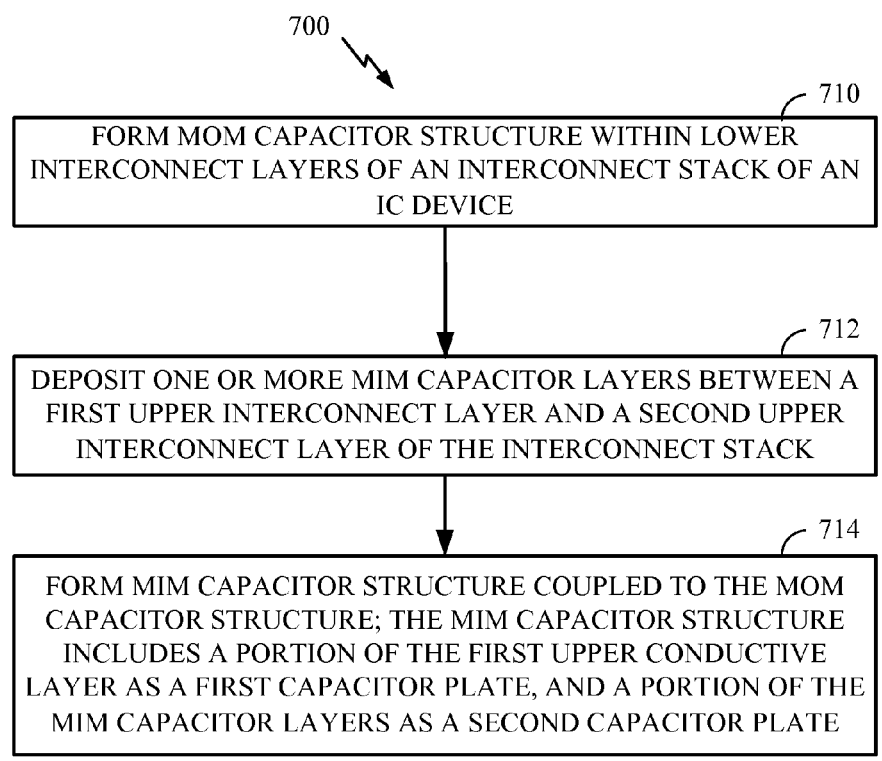
FIG. 7 illustrates a method for fabricating a complementary back end of line (BEOL) capacitor according to an aspect of the present disclosure.

FIG. 7 illustrates a method 700 for fabricating a complementary back end of line (BEOL) capacitor (CBC) structure according to an aspect of the disclosure. In block 710, a metal oxide metal (MOM) capacitor structure is formed within the lower interconnect layers of an interconnect stack of an integrated circuit (IC) device. For example, as shown in FIG. 1, a MOM capacitor 130 is formed within the lower conductive interconnect layers (e.g., M1-M6) of an interconnect stack 110. In block 712, one or more metal insulator metal (MIM) capacitor layers are deposited between a first upper interconnect layer and a second upper interconnect layer of an interconnect stack.

For example, as shown in FIG. 2, a conventional process of forming a MIM capacitor between a first upper interconnect layer 212 (M9) and a second upper interconnect layer 214 (M10) is modified. Rather than using the conventional MIM process to form a top plate and a bottom plate of a MIM capacitor, in this configuration, a bottom plate mask and deposition process are used to fabricate a first capacitor plate (top plate 252) of the MIM capacitor structure 250. In addition, a first upper interconnect layer 212 (e.g., M9) provides a second capacitor plate of the MIM capacitor structure 250. In an alternative configuration, a top plate 358 is fabricated using a modified MIM process to fabricate only a top plate 366 of a MIM capacitor, for example, as shown in FIG. 3. That is, the conventional MIM process is modified to skip the mask and deposition for fabricating the bottom plate of a MIM capacitor that may be formed between the first upper interconnect layer 212 (M9) and the second upper interconnect layer 214 (M10).

Referring again to FIG. 7, at block 714, a MIM capacitor structure is formed that is coupled to a MOM capacitor structure. For example, as shown in FIG. 2, the MIM capacitor structure 250 includes at least a portion of the first upper interconnect layer 212 as a first capacitor plate, and a second capacitor plate (top plate 252) includes the bottom capacitor plate formed according to a modified MIM fabrication process. For example, as shown in FIG. 2, a single one of a top plate or a bottom plate of a MIM capacitor is used to form a MIM capacitor structure between the top/bottom plate of the conventional MIM capacitor and one of the upper conductive interconnect layers. In particular, one aspect of the present disclosure couples the MIM capacitor structure 250 with the positive and negative nodes of the MOM capacitor structure 230 to form a CBC structure 220, for example, as shown in FIG. 2.

In one configuration, a complementary back end of line (BEOL) capacitor (CBC) structure of an integrated circuit (IC) device includes a means for storing electric charge coupled to a first upper interconnect layer of an interconnect stack of an integrated circuit (IC) device. The electric charge storing means includes at least one lower interconnect layer of the interconnect stack. In one aspect of the disclosure, the electric charge storing means may be the MOM capacitor structure 230 configured to perform the functions recited by the electric charge storing means. The CBC structure may also include a second upper interconnect layer of the interconnect stack coupled to the electric charge storing means. The CBC structure also includes at least one metal insulator metal (MIM) capacitor layer between the first upper interconnect layer and the second upper interconnect layer. In addition, the CBC structure includes a MIM capacitor structure coupled to the electric charge storing means. The MIM capacitor structure includes a first capacitor plate having at least a portion of the first upper interconnect layer, and a second capacitor plate having at least a portion of the at least one MIM capacitor layer. In another aspect, the aforementioned means may be any device configured to perform the functions recited by the electric charge storing means.

Figure 8:
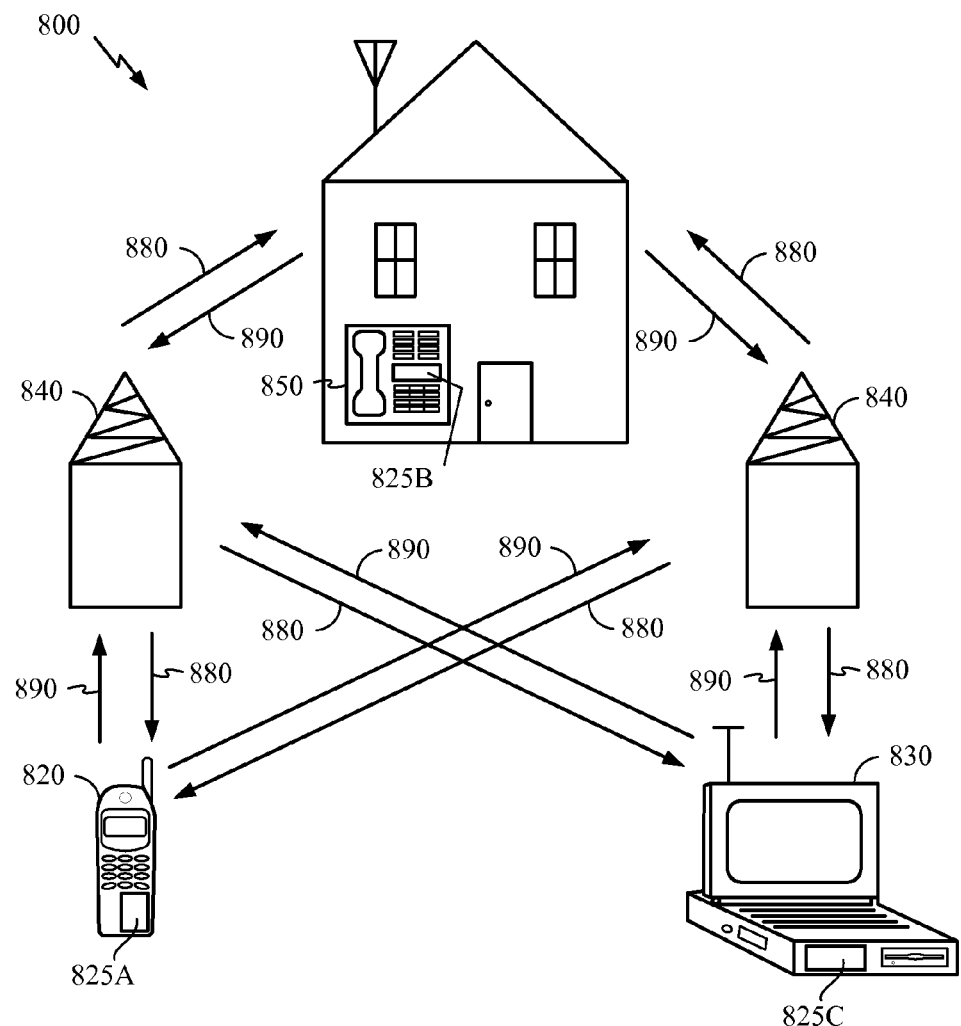
FIG. 8 shows an exemplary wireless communication system in which an aspect of the disclosure may be advantageously employed.

FIG. 8 shows an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include CBC structures 825A, 825B, and 825C. FIG. 8 shows forward link signals 880 from the base stations 840 and the remote units 820, 830, and 850 and reverse link signals 890 from the remote units 820, 830, and 850 to base stations 840.

In FIG. 8, the remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 8 illustrates remote units, which may employ CBC structures 825A, 825B, 825C according to the teachings of the disclosure, the disclosure is not limited to these exemplary illustrated units. For instance, a CBC structure according to aspects of the present disclosure may be suitably employed in any device.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A capacitor comprising:
   a metal oxide metal (MOM) capacitor structure coupled to a first upper interconnect layer of an interconnect stack of an integrated circuit (IC) device, the MOM capacitor structure comprising at least one lower interconnect layer of the interconnect stack;
   a second upper interconnect layer of the interconnect stack coupled to the MOM capacitor structure;
   at least one metal insulator metal (MIM) capacitor layer between the first upper interconnect layer and the second upper interconnect layer; and
   a metal insulator metal (MIM) capacitor structure coupled to the MOM capacitor structure, the MIM capacitor structure comprising a first capacitor plate including at least a portion of the first upper interconnect layer, and a second capacitor plate including at least a portion of the at least one MIM capacitor layer.

2. The capacitor of claim 1, further comprising an additional MIM capacitor structure between the first upper interconnect layer and the second upper interconnect layer of the interconnect stack, the additional MIM capacitor structure comprising a first capacitor plate, a dielectric layer, and the first capacitor plate of the MIM capacitor structure as a second capacitor plate.

3. The capacitor of claim 2, in which a first portion of the second upper interconnect layer is coupled to the first capacitor plate of the additional MIM capacitor structure and a second portion of the second upper interconnect layer is coupled to the second capacitor plate of the additional MIM capacitor structure.

4. The capacitor of claim 1, integrated into a cell phone, a hand-held personal communication system (PCS) unit, a set top box, a music player, a video player, an entertainment unit, a navigation device, a portable data unit, and/or a fixed location data unit.

5. A capacitor comprising:
   a first metal insulator metal (MIM) capacitor structure comprising a first capacitor plate and a first upper interconnect layer of an interconnect stack of an integrated circuit (IC) device as a second capacitor plate; and
   a second metal insulator metal (MIM) capacitor structure between the first upper interconnect layer and a second upper interconnect layer of the interconnect stack, the second MIM capacitor structure comprising a first capacitor plate, a dielectric layer, and the first capacitor plate of the first MIM capacitor structure as a second capacitor plate.

6. The capacitor of claim 5, in which a first portion of the second upper interconnect layer is coupled to the first capacitor plate of the second MIM capacitor structure and a second portion of the second upper interconnect layer is coupled to the second capacitor plate of the second MIM capacitor structure.

7. The capacitor of claim 5, further comprising a metal oxide metal (MOM) capacitor structure coupled to the first upper interconnect layer of the interconnect stack, the MOM capacitor structure comprising at least one lower interconnect layer of the interconnect stack.

8. The capacitor of claim 5, integrated into a cell phone, a hand-held personal communication system (PCS) unit, a set top box, a music player, a video player, an entertainment unit, a navigation device, a portable data unit, and/or a fixed location data unit.

9. A capacitor comprising:
- a means for storing electric charge coupled to a first upper interconnect layer of an interconnect stack of an integrated circuit (IC) device, the charge storing means including at least one lower interconnect layer of the interconnect stack;
- a second upper interconnect layer of the interconnect stack coupled to the electric charge storing means;
- at least one metal insulator metal (MIM) capacitor layer between the first upper interconnect layer and the second upper interconnect layer; and
- a metal insulator metal (MIM) capacitor structure coupled to the electric charge storing means, the MIM capacitor structure comprising a first capacitor plate including at least a portion of the first upper interconnect layer, and a second capacitor plate including at least a portion of the at least one MIM capacitor layer.

10. The capacitor of claim 9, further comprising an additional MIM capacitor structure between the first upper interconnect layer and the second upper interconnect layer of the interconnect stack, the additional MIM capacitor structure comprising a first capacitor plate, a dielectric layer, and the first capacitor plate of the MIM capacitor structure as a second capacitor plate.

11. The capacitor of claim 10, in which a first portion of the second upper interconnect layer is coupled to the first capacitor plate of the additional MIM capacitor structure and a second portion of the second upper interconnect layer is coupled to the second capacitor plate of the additional MIM capacitor structure.

12. The capacitor of claim 9, integrated into a cell phone, a hand-held personal communication system (PCS) unit, a set top box, a music player, a video player, an entertainment unit, a navigation device, a portable data unit, and/or a fixed location data unit.

* * * * *